(12) United States Patent
Yang et al.

(10) Patent No.: US 8,759,832 B2
(45) Date of Patent: Jun. 24, 2014

(54) SEMICONDUCTOR DEVICE AND ELECTROLUMINESCENT DEVICE AND METHOD OF MAKING THE SAME

(75) Inventors: Chao-Shun Yang, Hsin-Chu (TW); Hsing-Hung Hsieh, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 221 days.

(21) Appl. No.: 13/423,288

(22) Filed: Mar. 19, 2012

(65) Prior Publication Data
US 2013/0015448 A1 Jan. 17, 2013

(30) Foreign Application Priority Data

Jul. 14, 2011 (TW) .............................. 100124912 A
Nov. 18, 2011 (TW) .............................. 100142437 A

(51) Int. Cl.
*H01L 29/04* (2006.01)
*H01L 29/10* (2006.01)
*H01L 31/00* (2006.01)

(52) U.S. Cl.
USPC .................. 257/59; 257/57; 257/66; 257/72; 438/149; 438/151; 438/157

(58) Field of Classification Search
USPC ........... 257/40, 43, 49, 52, 57, 59, 60, 61, 66, 257/67, 69, 70, 72, 75, 213, 220, 221, 241, 257/249, 250, 258, 347; 438/149, 151, 154, 438/156, 157, 158, 175, 176, 181, 166
See application file for complete search history.

(56) References Cited

U.S. PATENT DOCUMENTS

| | | | |
|---|---|---|---|
| 7,102,164 B2 * | 9/2006 | Zhang | 257/59 |
| 2007/0029614 A1* | 2/2007 | Shiota et al. | 257/347 |
| 2008/0179598 A1 | 7/2008 | Kim | |
| 2008/0230768 A1 | 9/2008 | Goh | |
| 2009/0002590 A1 | 1/2009 | Kimura | |
| 2010/0052066 A1 | 3/2010 | Yu | |
| 2010/0181574 A1 | 7/2010 | Liu | |
| 2010/0182223 A1 | 7/2010 | Choi | |
| 2010/0252833 A1 | 10/2010 | Liu | |
| 2011/0084314 A1* | 4/2011 | Or-Bach et al. | 257/209 |

FOREIGN PATENT DOCUMENTS

CN 101271925 A 9/2008

* cited by examiner

*Primary Examiner* — Thanh Y Tran
(74) *Attorney, Agent, or Firm* — Winston Hsu; Scott Margo

(57) ABSTRACT

A semiconductor device, disposed on a substrate, includes a first channel layer, a patterned doped layer, a gate insulating layer, a conducting gate electrode, a second channel layer, a first electrode and a second electrode, and a third electrode and a fourth electrode. The first channel layer is disposed on the substrate and in a first region. The patterned doped layer includes a doped gate electrode disposed in a second region, and two contact electrodes electrically connected to two sides of the first channel layer, respectively. The conducting gate electrode is disposed on the gate insulating layer in the first region. The second channel layer is disposed on the gate insulating layer in the second region. The first electrode and the second electrode are electrically connected to the contact electrodes, respectively. The third electrode and the fourth electrode are electrically connected to two sides of the second channel layer, respectively.

34 Claims, 14 Drawing Sheets

SEMICONDUCTOR DEVICE AND ELECTROLUMINESCENT DEVICE AND METHOD OF MAKING THE SAME

BACKGROUND OF THE INVENTION

1. Field of the Invention

The present invention relates to a semiconductor device, an electroluminescent device and method of making the same, and more particularly, to a semiconductor device and an electroluminescent device in which the contact electrodes of one thin film transistor device and the doped gate electrode of another thin film transistor device are defined by the same patterned doped layer, and the method of making the same.

2. Description of the Prior Art

Compared with amorphous silicon thin film transistor (TFT) device, poly silicon TFT device has advanced electrical performance due to the high electrical mobility of poly silicon material. As the technique of lower temperature poly silicon (LTPS) process progresses, some main issues such as poor film uniformity of large area film have gradually been improved. Therefore, the LTPS process is expected to be applicable in large size substrate. In conventional LTPS process, the doped layer used to reduce the contact resistance of the TFT device is normally formed by ion implant process. However, there are technical problems required to be solved when introducing the implant apparatus to large size substrate process. For example, the cost of the implant apparatus for large size substrate process is extremely high. Thus, to form a doped layer with low resistance by anther approach is one of the main issues to be addressed.

SUMMARY OF THE INVENTION

It is therefore one of the objectives of the present invention to provide a semiconductor device, an electroluminescent device and a fabrication method thereof to solve the aforementioned problem.

According to a preferred embodiment, a semiconductor device is provided. The semiconductor device is disposed on a substrate, which has a first region and a second region. The semiconductor device includes a first channel layer, a patterned doped layer, a gate insulating layer, a conducting gate electrode, a second channel layer, a first electrode and a second electrode, and a third electrode and a fourth electrode. The first channel layer is disposed on the substrate and in the first region. The patterned doped layer includes a doped gate electrode and two contact electrodes, wherein the doped gate electrode is disposed on the substrate and in the second region, and the contact electrodes are electrically connected to two sides of the first channel layer, respectively. The gate insulating layer covers the first channel layer and the patterned doped layer. The conducting gate electrode is disposed on the gate insulating layer and in the first region. The second channel layer is disposed on the gate insulating layer and in the second region. The first electrode and the second electrode are electrically connected to the contact electrodes, respectively. The third electrode and the fourth electrode are electrically connected to two sides of the second channel layer, respectively.

According to another preferred embodiment, a method for forming a semiconductor device including the following steps is provided. A substrate having a first region and a second region is provided. A first channel layer is formed in the first region of the substrate. A patterned doped layer is formed on the substrate, wherein the patterned doped layer includes two contact electrodes electrically connected to two sides of the first channel layer in the first region, respectively; and a doped gate electrode disposed on the substrate and in the second region. A gate insulating layer is formed to cover the first channel layer, the contact electrodes and the doped gate electrode. A conducting gate electrode is formed on the gate insulating layer and in the first region. A second channel layer is formed on the gate insulating layer and in the second region. A first electrode and a second electrode are formed to electrically connect to the contact electrodes, respectively. A third electrode and a fourth electrode are formed to electrically connect to two sides of the second channel layer, respectively.

According to still another preferred embodiment, an electroluminescent device is provided. The electroluminescent device is disposed on a substrate, which has a first region and a second region. The electroluminescent device includes a first channel layer, a patterned doped layer, a gate insulating layer, a conducting gate electrode, a second channel layer, a first electrode and a second electrode, a third electrode and a fourth electrode, and a light-emitting device. The first channel layer is disposed on the substrate and in the first region. The patterned doped layer includes a doped gate electrode and two contact electrodes, wherein the doped gate electrode is disposed on the substrate and in the second region, and the contact electrodes are electrically connected to two sides of the first channel layer, respectively. The gate insulating layer covers the first channel layer and the patterned doped layer. The conducting gate electrode is disposed on the gate insulating layer and in the first region. The second channel layer is disposed on the gate insulating layer and in the second region. The first electrode and the second electrode are electrically connected to the contact electrodes, respectively. The third electrode and the fourth electrode are electrically connected to two sides of the second channel layer, respectively. The light-emitting device is electrically connected to the first electrode.

The contact electrodes and the doped gate electrode of the semiconductor device of the present invention are formed by non-implant process, and thus the manufacturing process is simplified. Also, the resistance between the contact electrodes and the doped gate electrode is reduced by performing an annealing process, and thus the electrical performance of the semiconductor device can be advanced. The electroluminescent device and the semiconductor device thereof include the contact electrodes formed by non-implant process, and thus can be applied in large size display panel.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be made in detail. The preferred embodiments of the present invention are illustrated in the accompanying drawings with numbered elements.

Figure 1:
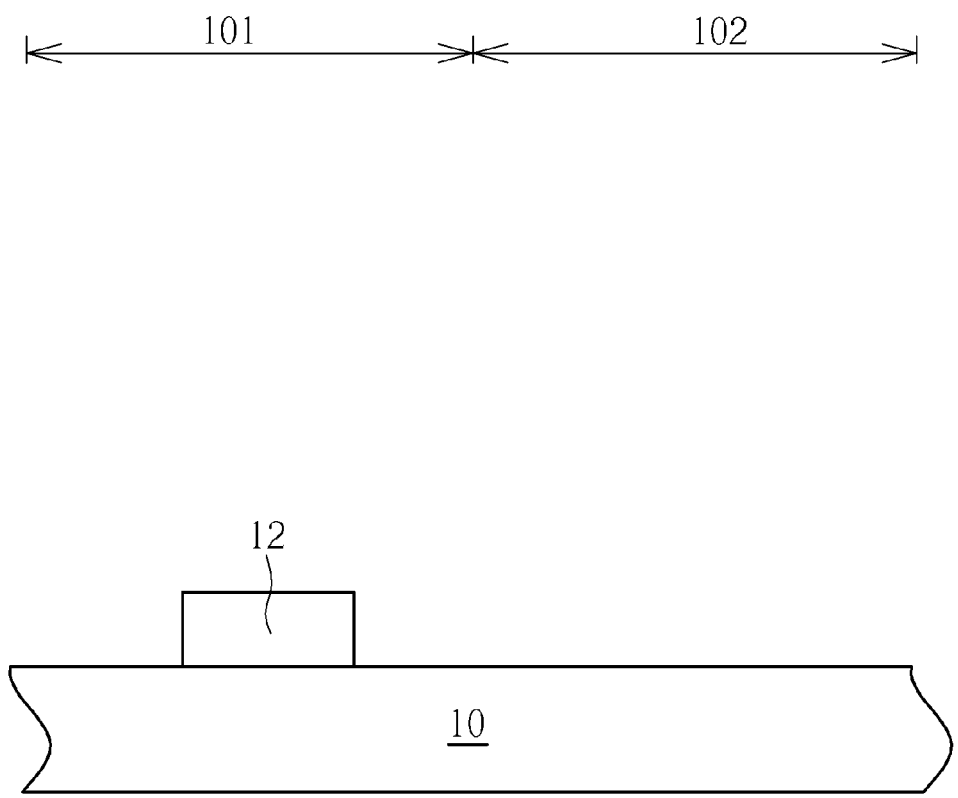
FIGS. 1-4 are schematic diagrams illustrating a method for forming a semiconductor device according to a first preferred embodiment of the present invention.

Please refer to FIGS. 1-4. FIGS. 1-4 are schematic diagrams illustrating a method for forming a semiconductor device according to a first preferred embodiment of the present invention. As shown in FIG. 1, a substrate 10 is first provided. The substrate 10 may be a transparent substrate e.g. a glass substrate, a plastic substrate or a quartz substrate, but not limited thereto. The substrate 10 has a first region 101 and a second region 102. The first region 101 is used to dispose a first thin film transistor (TFT) device, while the second region 102 is used to dispose a second TFT device. Subsequently, a first channel layer 12 is formed in the first region 101 of the substrate 10. In this embodiment, the first channel layer 12 is an amorphous silicon semiconductor layer, and can be converted into a poly silicon semiconductor layer by performing an annealing process e.g. a laser treatment. The material of the first channel layer 12 is not limited, and may be other types of semiconductor materials.

Figure 2:
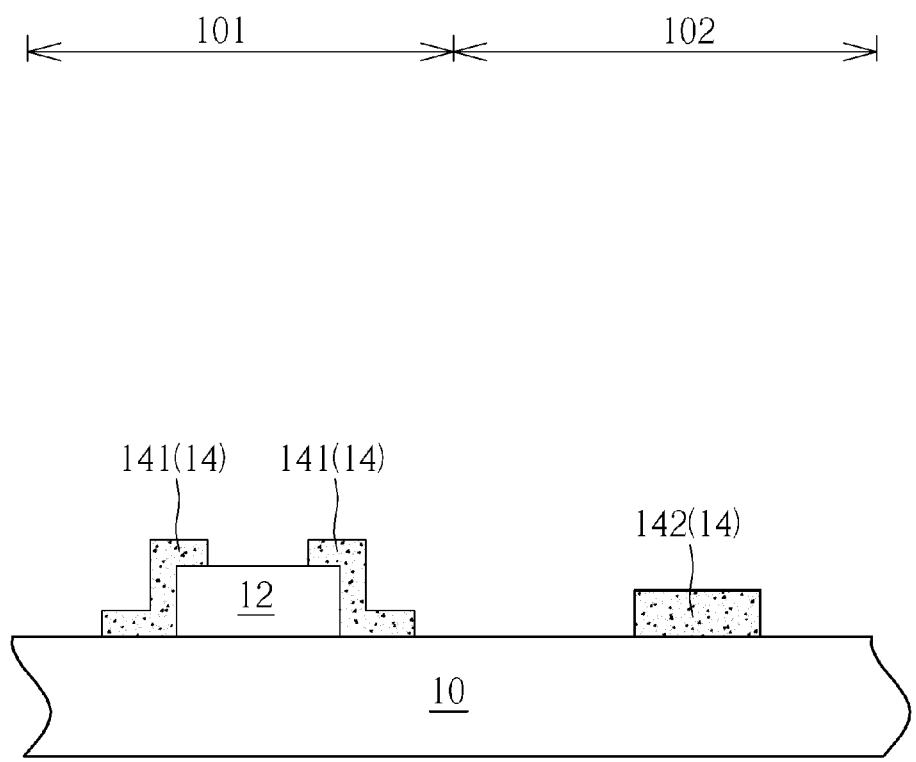

As shown in FIG. 2, a patterned doped layer 14 is formed on the substrate 10. The patterned doped layer 14 includes two contact electrodes 141 disposed in the first region 101 and electrically connected to two sides of the first channel layer 12, and a doped gate electrode 142 disposed in the second region 102 of the substrate 10. The contact electrodes 141 are used as the ohmic contact layers of the first TFT device for reducing the contact resistance between the first channel layer 12 and the electrodes to be formed. The doped gate electrode 142 is used as the gate electrode of the second TFT device. In this embodiment, the step of forming the patterned doped layer 14 includes performing a non-implant process, which therefore can be applied in a large size substrate. For example, the non-implant process may include a chemical vapor deposition (CVD) process, a physical vapor deposition (PVD) process, a spin-on coating process, and etc. By virtue of the non-implant process, a semiconductor layer (not shown) can be formed, and dopants can be introduced in the process to form a doped semiconductor layer (not shown). Then, a patterning process e.g. a photolithography and etching process is formed to form the patterned doped layer 14. In addition, in this embodiment, the patterned doped layer 14 may include a P type patterned doped layer, and thus the dopants can be, for instance, boron or boron containing compound, but not limited thereto. Also, an annealing process e.g. a laser treatment can be performed subsequent to forming the patterned doped layer 14 or prior to patterning the doped semiconductor layer to reduce the resistance of the patterned doped layer 14. Furthermore, the annealing process for converting the amorphous silicon semiconductor layer into the poly silicon semiconductor layer and the annealing process for reducing the resistance of the patterned doped layer 14 can be integrated as one single annealing process.

Figure 3:
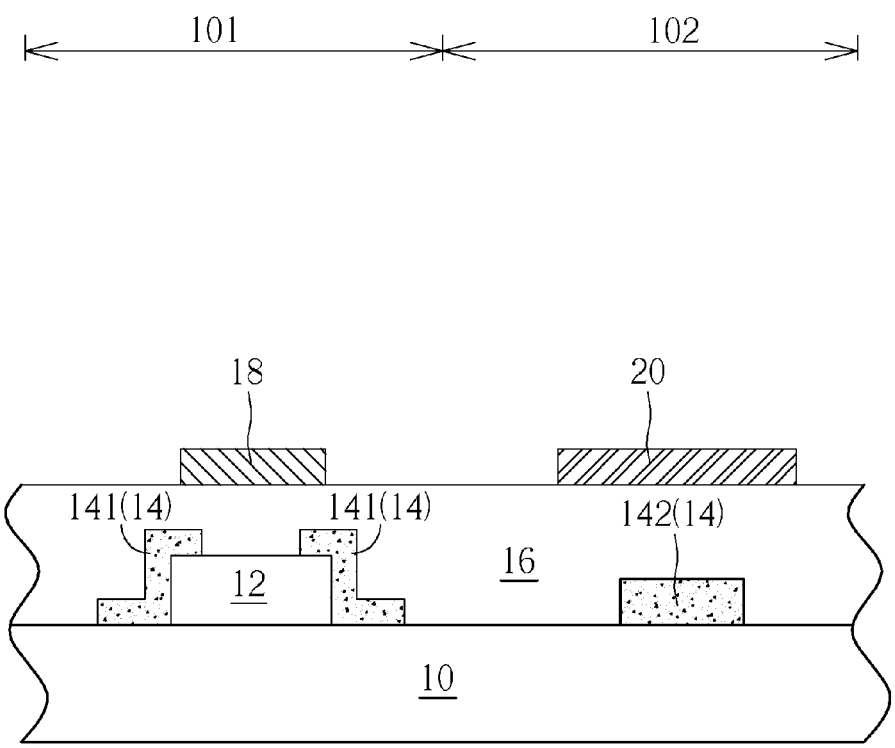

As shown in FIG. 3, a gate insulating layer 16 is formed on the substrate 10 to cover the first channel layer 12, the contact electrodes 141 and the doped gate electrode 142. The material of the gate insulating layer 16 can be various types of dielectric materials such as silicon oxide, silicon nitride or silicon oxynitride, but not limited thereto. Additionally, the gate insulating layer 16 may be a single-layered dielectric structure or a composite-layered dielectric structure. Subsequently, a conducting gate electrode 18 is formed on the gate insulating layer 16 and in the first region 101, and a second channel layer 20 is formed on the gate insulating layer 16 and in the second region 102. The conducting gate electrode 18 is used as the gate electrode of the second TFT device, and the material of the conducting gate electrode 18 may be any suitable conductive material with good conductivity such as metal. The second channel layer 20 may be selected from an amorphous silicon semiconductor layer, an oxide semiconductor layer or an organic semiconductor layer, but not limited thereto.

In a variant embodiment, the first channel layer, the doped gate electrode and the contact electrodes may also be formed by another approach. For example, a patterned undoped semiconductor layer (not shown) is first formed on the substrate 10. The patterned undoped semiconductor layer is corresponding to locations where the first channel layer, the contact electrodes and the doped gate electrode are to be formed. Then, the gate insulating layer 16 and the conducting gate electrode 18 are formed on the patterned undoped semiconductor layer. Subsequently, an implant process is performed on the patterned undoped semiconductor layer by using the conducting gate electrode 18 as a mask. Consequently, the patterned undoped semiconductor layer blocked by the conducting gate electrode 18 will form the first channel layer 12, while the patterned undoped semiconductor layer not blocked by the conducting gate electrode 18 will form the contact electrodes 141 and the doped gate electrode 142. In this variant embodiment, the contact electrodes 141 are disposed on two sides of the first channel layer 12, and coplanar with the first channel layer 12.

Figure 4:
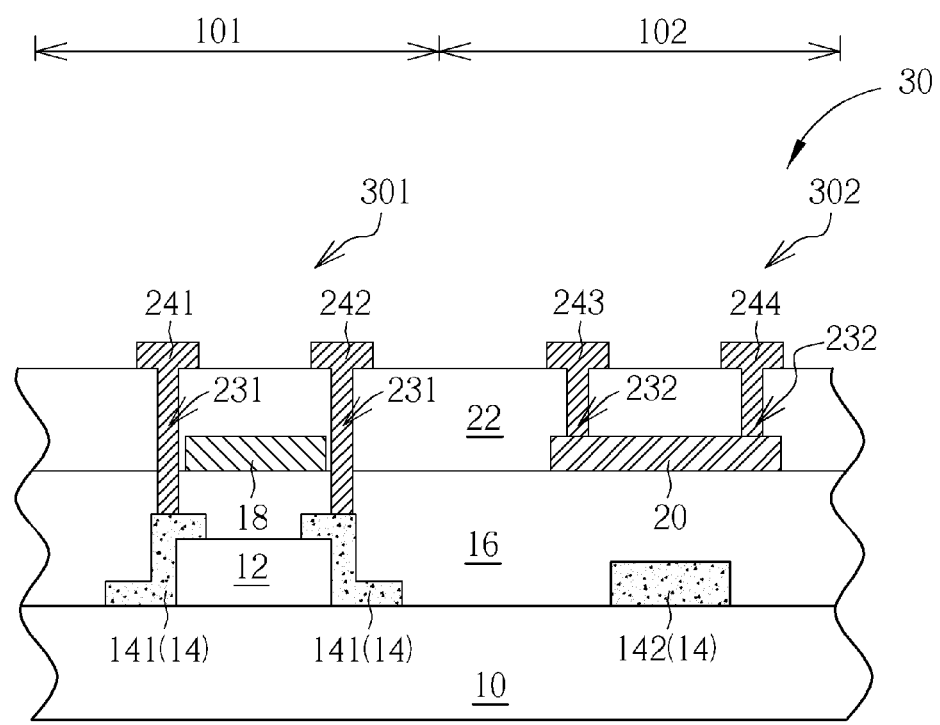

As shown in FIG. 4, at least one inter-layered dielectric (ILD) layer 22 is formed on the gate insulating layer 16, the conducting gate electrode 18 and the second channel layer 20. Next, a plurality of first contact holes 231 are formed in the ILD layer 22 and in the gate insulating layer 16 to expose the contact electrodes 141, respectively; and a plurality of second contact holes 232 are formed in the ILD layer 22 to expose the second channel layer 20. The material of the ILD layer 22 may be various types of dielectric materials such as silicon oxide, silicon nitride or silicon oxynitride, but not limited thereto. Subsequently, a first electrode 241 and a second electrode 242 are formed on the ILD layer 22 in the first region 101, and the first electrode 241 and the second electrode 242 are electrically connected to the contact electrodes 141 through the first contact holes 231, respectively. The first electrode 241 and the second electrode 242 are served as the source/drain electrodes of the first TFT device. Also, a third electrode 243 and a fourth electrode 244 are formed on the ILD layer 22 in the second region 102, and the third electrode 243 and the fourth electrode 244 are electrically connected to two sides of the second channel layer 20 through the second contact holes 232, respectively. The third electrode 243 and the fourth electrode 244 are served as the source/drain electrodes of the second TFT device. The first electrode 241, the second electrode 242, the third electrode 243 and the fourth electrode 244 may be defined by the same photomask, and the material thereof may be metal, but not limited thereto.

By performing the aforementioned process, a semiconductor device 30 of this embodiment can be accomplished. In the first region 101, the first channel layer 12, the contact electrodes 141, the gate insulating layer 16, the conducting gate electrode 18, the first electrode 241 and the second electrode 242 form a first TFT device 301; and in the second region 102, the doped gate electrode 142, the gate insulating layer 16, the second channel layer 20, the third electrode 243 and the fourth electrode 244 form a second TFT device 302. In addition, the first TFT device 301 may be a P type TFT device, and the second TFT device 302 may be an N type TFT device, but not limited thereto.

In addition to the aforementioned embodiment, the present invention further provides an electroluminescent device including the semiconductor device. The semiconductor device and the luminescent device according to other different preferred embodiments will be illustrated in the following passages. To simplify the description, the identical components in each of the following embodiments are marked with identical symbols. For making it easier to compare the difference between the embodiments, the following description will detail the dissimilarities among different embodiments and the identical features will not be redundantly described.

Figure 5:
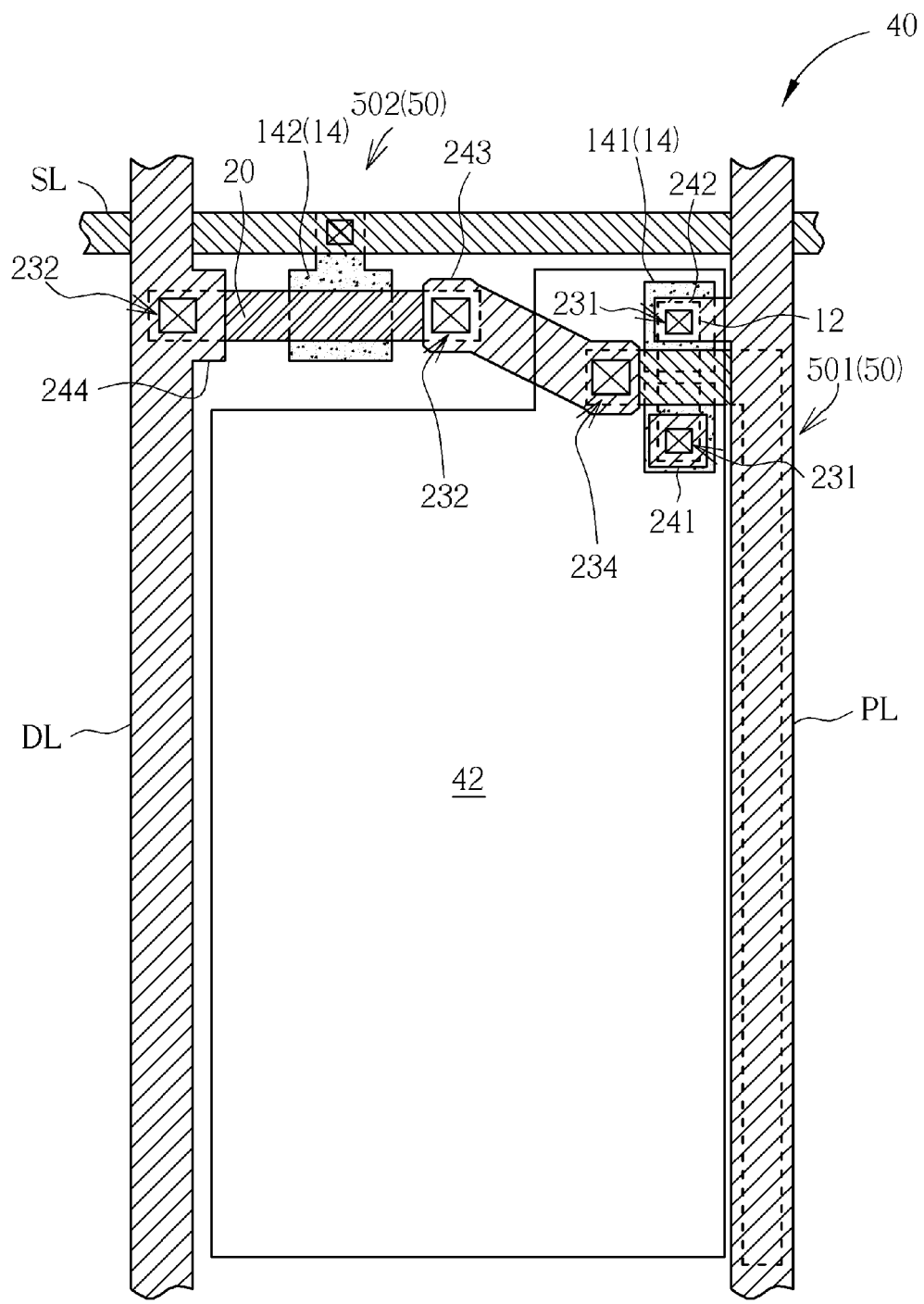
FIG. 5 is a top view illustrating an electroluminescent device according to a second preferred embodiment of the present invention.
Figure 6:
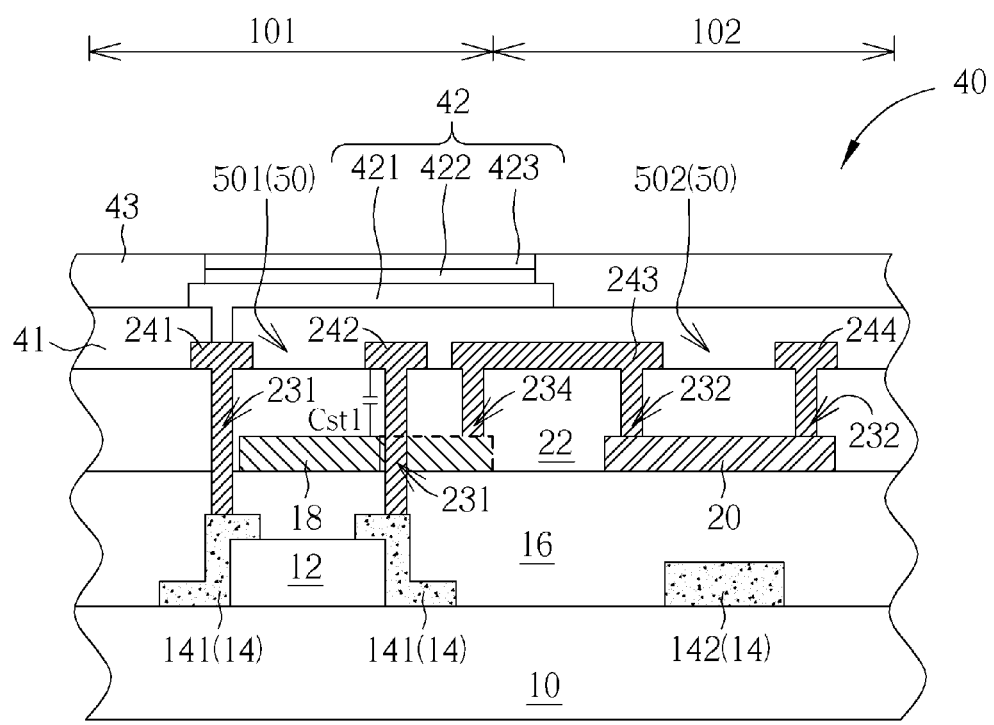
FIG. 6 is a cross-sectional view illustrating an electroluminescent device according to a second preferred embodiment of the present invention.
Figure 7:
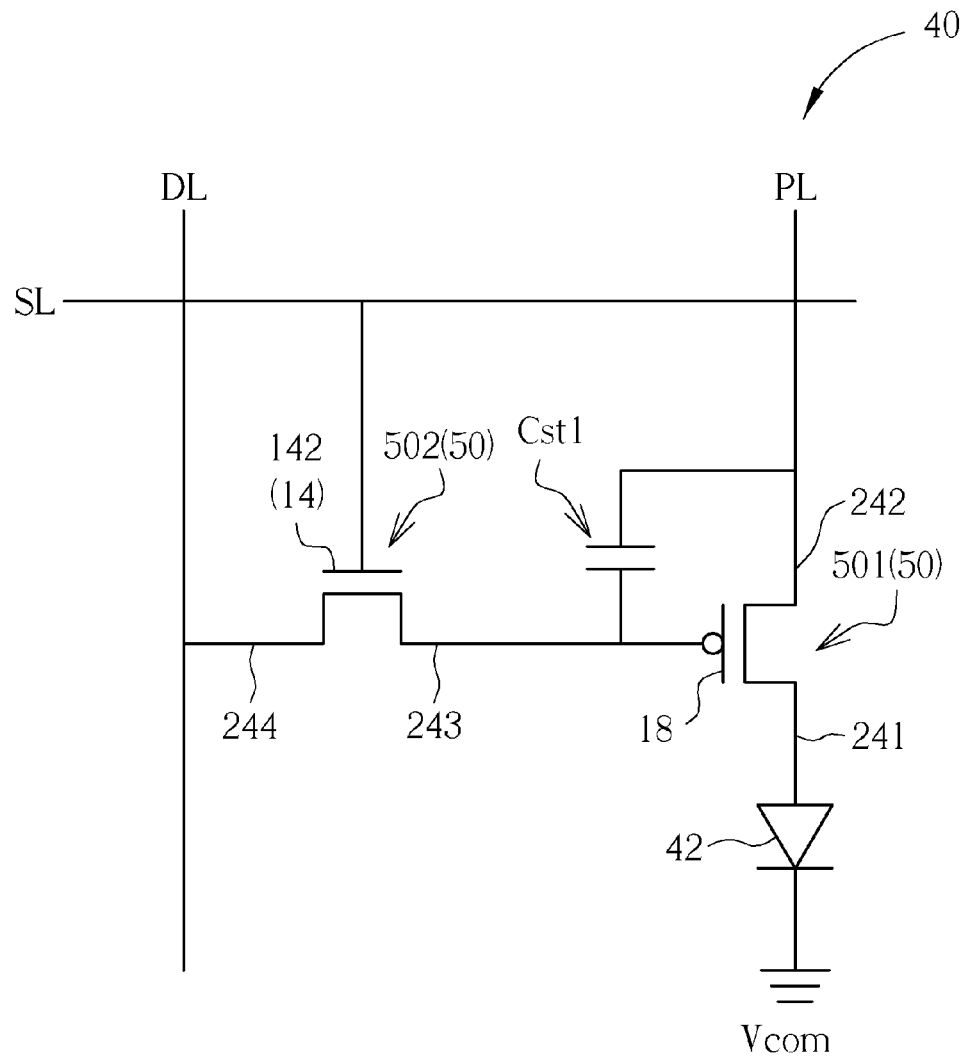
FIG. 7 is diagram illustrating a circuit structure of an electroluminescent device according to a second preferred embodiment of the present invention.

Please refer to FIGS. 5-7 as well as FIG. 4. FIG. 5 is a top view illustrating an electroluminescent device according to a second preferred embodiment of the present invention, FIG. 6 is a cross-sectional view illustrating an electroluminescent device according to a second preferred embodiment of the present invention, and FIG. 7 is a diagram illustrating a circuit structure of an electroluminescent device according to a second preferred embodiment of the present invention. As shown in FIGS. 5-7, the electroluminescent device 40 includes a semiconductor device 50, a first passivation layer 41, a light-emitting device 42 and a second passivation layer 43. The first passivation layer 41 covers the ILD layer 22, and exposes the first electrode 241. The light-emitting device 42 is disposed on the first passivation layer 41, and electrically connected to the exposed first electrode 241. The second passivation layer 43 is disposed on the first passivation layer 41, and at least partially exposes the light-emitting device 42. In this embodiment, the light-emitting device 42 is disposed on the first passivation layer 41, and thus the light-emitting can extend to the first region 101 and overlap the first TFT device 501 to increase the aperture ratio, but not limited thereto. For example, in case the first passivation layer 41 does not exist, the light-emitting device 42 can be disposed on the ILD layer 22 without overlapping the first TFT device 501. In this embodiment, the light-emitting device 42 may be, for instance, an organic light-emitting diode (OLED) device, but not limited thereto. The light-emitting device 42 includes an anode 421, a light-emitting layer 422 and a cathode 423. The anode 421 is electrically connected to the first electrode 241, and the cathode 423 is electrically connected to a common signal Vcom. The semiconductor device 50 of this embodiment is similar to the semiconductor device 30 illustrated in FIG. 4, but the difference is that the conducting gate electrode 18 of the semiconductor device 50 detours the second electrode 242 and extends to the other side of the second electrode 242. Also, the ILD layer 22 further has a fourth contact hole 234 partially exposing the conducting gate electrode 18. The third electrode 243 is electrically connected to the conducting gate electrode 18 through the fourth contact hole 234. In this embodiment, the first TFT device 501 is served as a driving TFT device, while the second TFT device 502 is served as a switching TFT device. In addition, the conducting gate electrode 18 partially overlaps the second electrode 242, forming a first storage capacitor Cst1. As shown in FIG. 5 and FIG. 7, the electroluminescent device 40 further includes a power line PL, a scan line SL and a data line DL. The power line PL is electrically connected to the second electrode 242, the scan line SL is electrically connected to the conducting gate electrode 18, and the data line DL is electrically connected to the fourth electrode 244.

Figure 8:
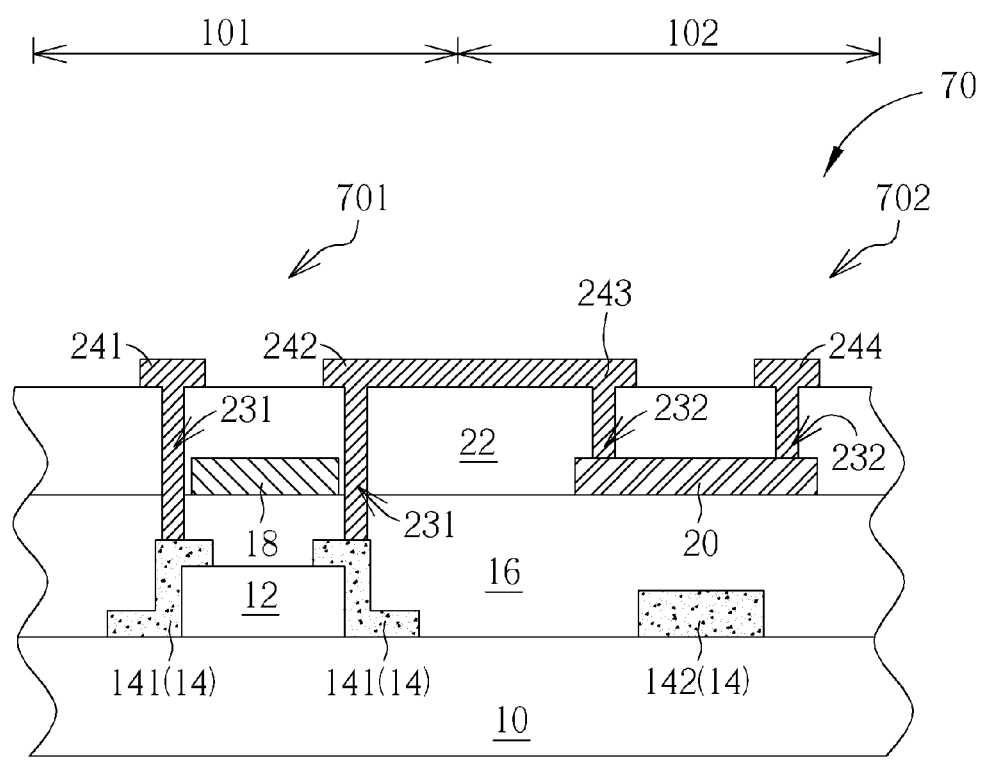
FIG. 8 is a schematic diagram illustrating a semiconductor device according to a third preferred embodiment of the present invention.

Please refer to FIG. 8. FIG. 8 is a schematic diagram illustrating a semiconductor device according to a third preferred embodiment of the present invention. As shown in FIG. 8, in the semiconductor device 70 of this embodiment, the second electrode 242 of the first TFT device 701 is electrically connected to the third electrode 243 of the second TFT device 702.

Figure 9:
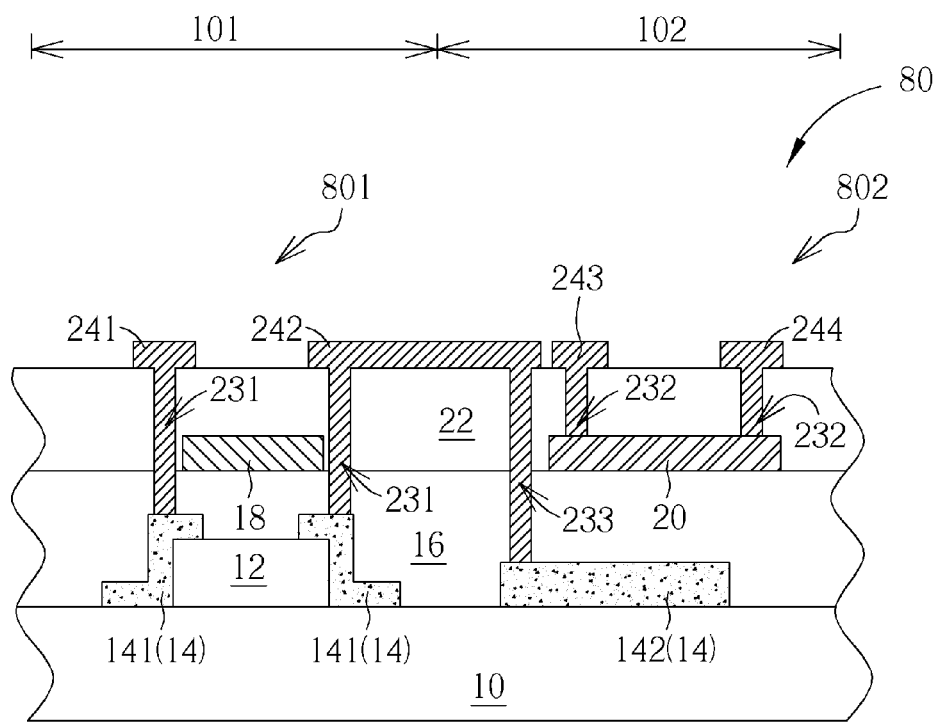
FIG. 9 is a schematic diagram illustrating a semiconductor device according to a fourth preferred embodiment of the present invention.

Please refer to FIG. 9. FIG. 9 is a schematic diagram illustrating a semiconductor device according to a fourth preferred embodiment of the present invention. As shown in FIG. 9, in the semiconductor device 80 of this embodiment, the doped gate electrode 142 of the second TFT device 802 protrudes out from the second channel layer 20, and the ILD layer 22 and the gate insulating layer 16 further have a third contact hole 233 partially exposing the doped gate electrode 142. In addition, the second electrode 242 of the first TFT device 801 is electrically connected to the doped gate electrode 142 of the second TFT device 802 through the third contact hole 233.

Figure 10:
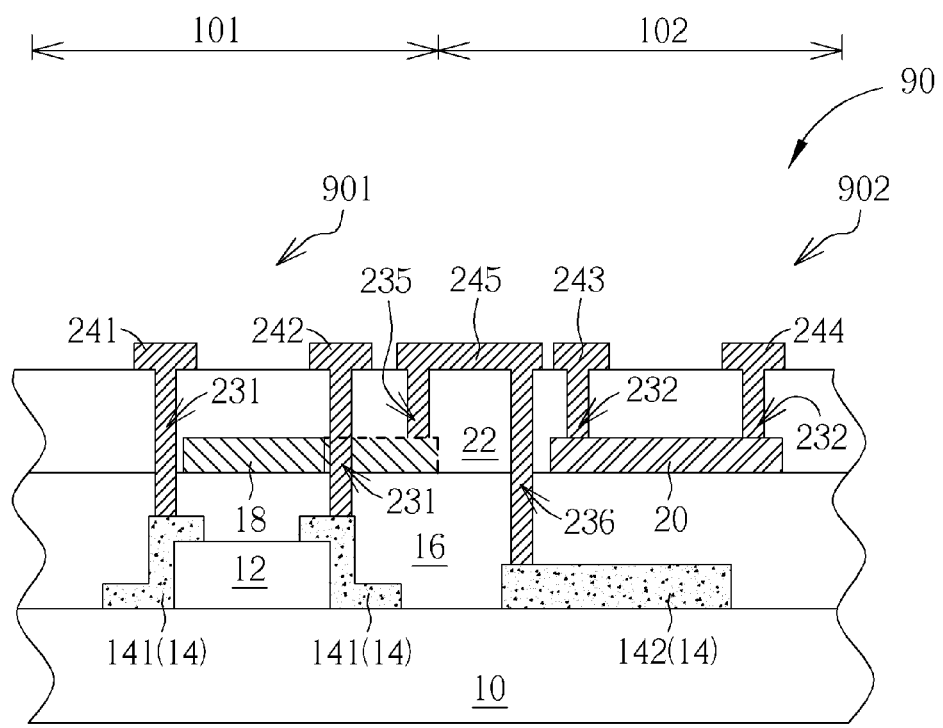
FIG. 10 is a schematic diagram illustrating a semiconductor device according to a fifth preferred embodiment of the present invention.

Please refer to FIG. 10. FIG. 10 is a schematic diagram illustrating a semiconductor device according to a fifth preferred embodiment of the present invention. As shown in FIG. 10, in the semiconductor device 90 of this embodiment, the conducting gate electrode 18 of the first TFT device 901 detours the second electrode 242 and extends to the other side of the second electrode 242, and the doped gate electrode 142 protrudes out from the second channel layer 20. The ILD layer 22 and the gate insulating layer 16 further have a fifth contact hole 235 partially exposing the conducting gate electrode 18, and a sixth contact hole 236 partially exposing the doped gate electrode 142. In addition, a connection electrode 245 is electrically connected to the conducting gate electrode 18 through the fifth contact hole 235, and electrically connected to the doped gate electrode 142 through the sixth contact hole 236, so that the conducting gate electrode 18 and the doped gate electrode 142 are electrically connected.

The third, fourth and fifth embodiments of the present invention illustrate different approaches of electrical connections between the first TFT device and the second TFT device of the semiconductor device, which can be selected based on different circuit designs. The electrical connection between the first TFT device and the second TFT device is not limited to the aforementioned approaches. Also, the semiconductor devices of the third, fourth and fifth embodiments can also be adopted to an electroluminescent device, but not limited thereto.

Figure 11:
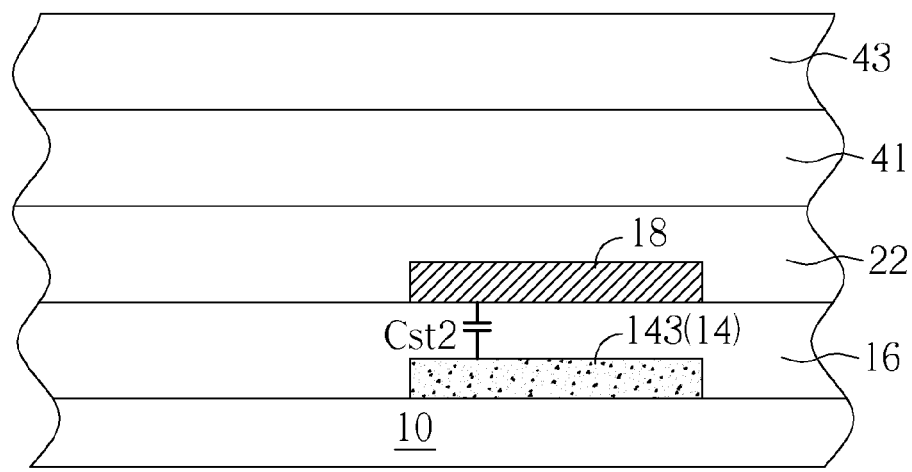
FIG. 11 is a schematic diagram illustrating a storage capacitor structure of an electroluminescent device according to a sixth preferred embodiment of the present invention.

Please refer to FIG. 11, as well as FIGS. 5-7. FIG. 11 is a schematic diagram illustrating a storage capacitor structure of an electroluminescent device according to a sixth preferred embodiment of the present invention. As shown in FIG. 11, the patterned doped layer 14 further includes a storage electrode 143 electrically connected to the power line PL shown in FIG. 7, and the conducting gate electrode 18 partially overlap the storage electrode 143 to form a second storage capacitor Cst2.

Figure 12:
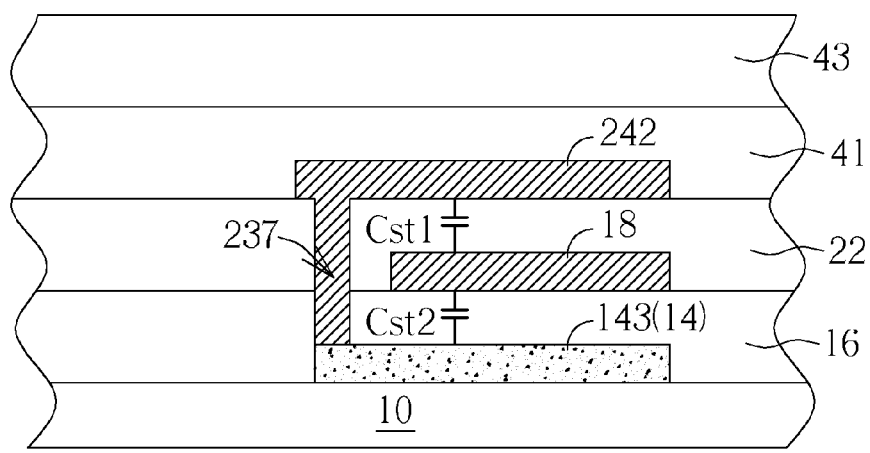
FIG. 12 is a schematic diagram illustrating a storage capacitor structure of an electroluminescent device according to a seventh preferred embodiment of the present invention.

Please refer to FIG. 12, as well as FIGS. 5-7. FIG. 12 is a schematic diagram illustrating a storage capacitor structure of an electroluminescent device according to a seventh preferred embodiment of the present invention. As shown in FIG. 12, the second electrode 242 is electrically connected to the power line PL shown in FIG. 7, and the conducting gate electrode 18 partially overlaps the second electrode 242 to form a first storage capacitor Cst1. Also, the patterned doped layer 14 further includes a storage electrode 143, and the ILD layer 22 and the gate insulating layer 16 have a contact hole 237. The second electrode 242 is electrically connected to the storage electrode 143 through the contact hole 237, and the conducting gate electrode 18 partially overlaps the storage electrode 143 to form a second storage capacitor Cst2. Accordingly, the first storage capacitor Cst1 and the second storage capacitor Cst2 are connected in parallel, and a greater storage capacitance can be obtained.

Figure 13:
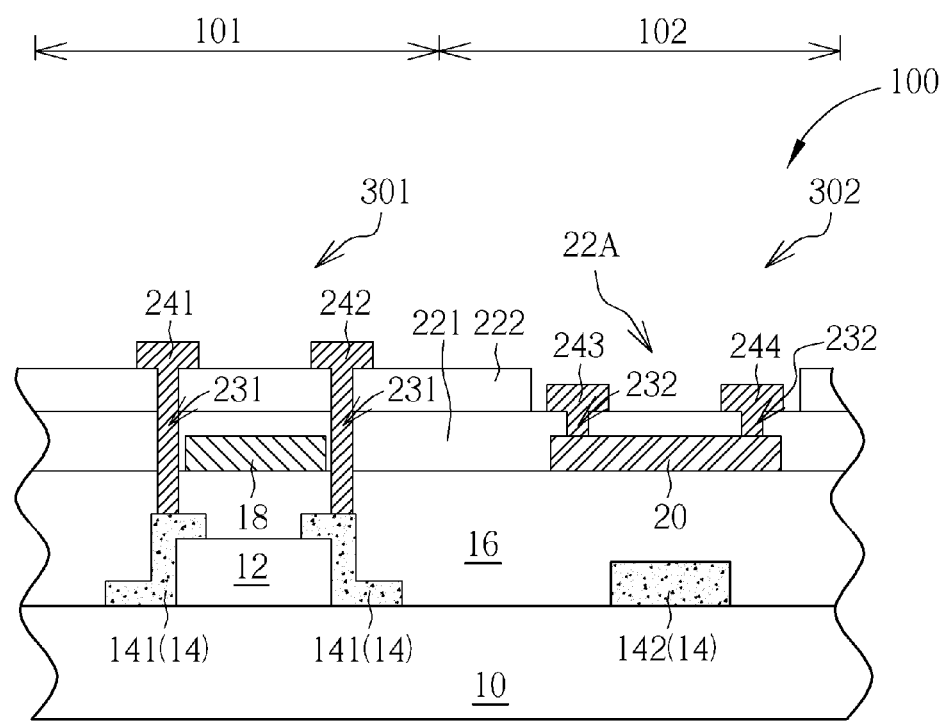
FIG. 13 is a schematic diagram illustrating a semiconductor device and a fabrication method thereof according to an eighth preferred embodiment of the present invention.

Please refer to FIG. 13. FIG. 13 is a schematic diagram illustrating a semiconductor device and a fabrication method thereof according to an eighth preferred embodiment of the present invention. As shown in FIG. 13, different from the single-layered inter-layered dielectric layer of the first preferred embodiment, the method of forming a semiconductor device 100 in this embodiment includes sequentially forming a first inter-layered dielectric layer 221 on the conducting gate electrode 18, the second channel layer 20 and the gate insulating layer 16, and forming a second inter-layered dielectric layer 222 overlying the first inter-layered dielectric layer 221. The first inter-layered dielectric layer 221 includes a silicon oxide layer, and the second inter-layered dielectric layer 222 includes a silicon nitride layer, but not limited thereto. For example, the first inter-layered dielectric layer 221 may include a silicon nitride layer, and the second inter-layered dielectric layer 222 may include a silicon oxide layer. In this embodiment, the first inter-layered dielectric layer 221, the second inter-layered dielectric layer 222 and the gate insulating layer 16 have a plurality of first contact holes 231 exposing each of the contact electrodes 141, respectively, in the first region 101. The second inter-layered dielectric layer 222 has an opening 22A corresponding to the second channel layer 20 and partially exposing the first inter-layered dielectric layer 221. The first inter-layered dielectric layer 221 has a plurality of second contact holes 232 exposing the second channel layer 20. The first contact holes 231, the second contact holes 232 and the opening 22A are preferably formed by the same photolithography and etching process with a half-tone mask or a gray-tone mask for reducing process steps. When the second inter-layered dielectric layer 222 is a silicon nitride layer, hydrogen atoms tend to diffuse to the second channel layer 20 during formation of the second inter-layered dielectric layer 222. In view of this issue, the second inter-layered dielectric layer 222 over the second channel layer 20 is removed to form the opening 22A, which is able to diminish hydrogenation of the second channel layer 20. Thus, semiconductor property of the second channel layer 20 can be ensured. In addition, in this embodiment, the first electrode 241 and the second electrode 242 are disposed on the second inter-layered dielectric layer 222 of the first region 101, and are electrically connected to each of the contact electrodes 141 through the first contact holes 231, respectively. Also, the third electrode 243 and the fourth electrode 244 are disposed in the opening 22A of the second inter-layered dielectric layer 222 of the second region 102 and disposed on the first inter-layered dielectric layer 221, and the third electrode 243 and the fourth electrode 244 are electrically connected to two sides of the second channel layer 20 through the second contact holes 232, respectively. In a variant embodiment of this embodiment, there may be no opening formed corresponding to the second channel layer 20 in the second inter-layered dielectric layer 222. In such a case, the second contact holes 232 may be formed in the first inter-layered dielectric layer 221 and the second inter-layered dielectric layer 222 to expose the second channel layer 20, and the thickness of the first inter-layered dielectric layer 221 is preferably thicker.

Figure 14:
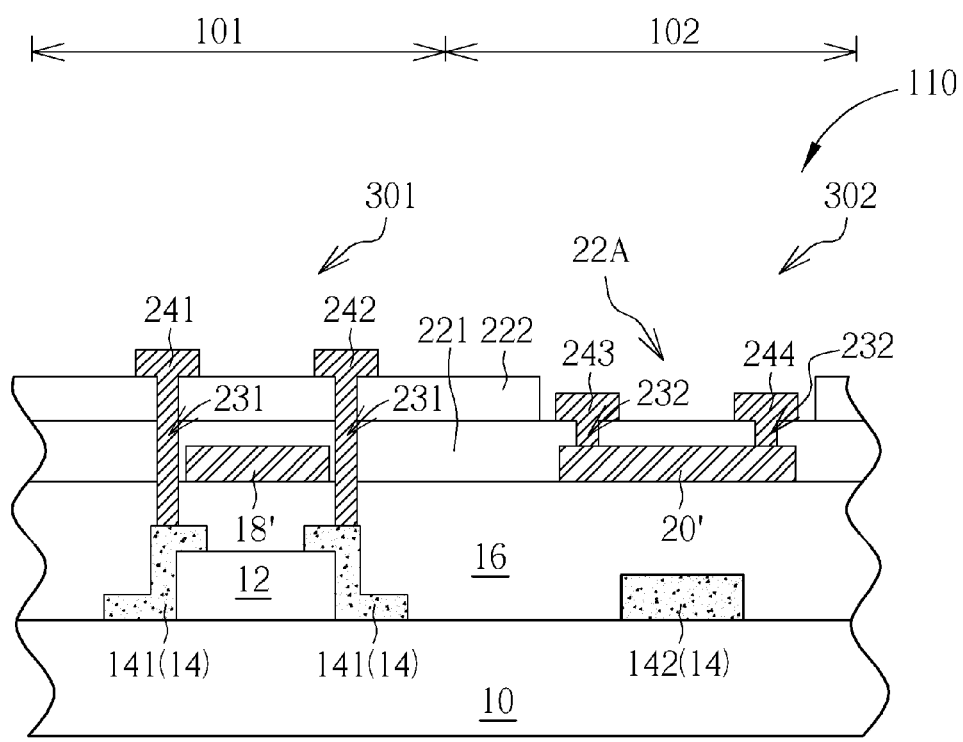
FIG. 14 is a schematic diagram illustrating a semiconductor device and a fabrication method thereof according to a ninth preferred embodiment of the present invention.

Please refer to FIG. 14. FIG. 14 is a schematic diagram illustrating a semiconductor device and a fabrication method thereof according to a ninth preferred embodiment of the present invention. As shown in FIG. 14, different from the aforementioned embodiment, in the semiconductor device 110 of this embodiment, the conducting gate electrode 18' and the second channel layer 20' are made of the same material layer. For example, the conducting gate electrode 18' and the second channel layer 20' may be made of the same oxide semiconductor layer, and patterned by the same patterning process e.g. photolithography and etching process, for reducing process steps. Also, when the second inter-layered dielectric layer 222 is a silicon nitride layer, hydrogen atoms tend to diffuse to the conducting gate electrode 18' during formation of the second inter-layered dielectric layer 222. Hydrogenation of the conducting gate electrode 18' can reduce the resistance, and thus makes the conducting gate electrode 18' possess conductivity. In addition, the conducting gate electrode 18' and the second channel layer 20' may also be an amorphous silicon semiconductor layer or an organic semiconductor layer. It is noted that the semiconductor device disclosed in each embodiment of the present invention can be incorporated into the electroluminescent device of the present invention. In other words, a light-emitting device can be formed as shown in FIG. 6 after the semiconductor device of any one of the embodiments is accomplished.

In summary, the contact electrodes and the doped gate electrode of the semiconductor device of the present invention is formed by non-implant process, and thus the manufacturing process is simplified. Also, the resistance between the contact electrodes and the doped gate electrode is reduced by performing an annealing process, and thus the electrical performance of the semiconductor device can be advanced. The electroluminescent device and the semiconductor device thereof include the contact electrodes formed by non-implant process, and thus can be applied in large size display panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, disposed on a substrate, the substrate having a first region and a second region, the semiconductor device comprising:
   a first channel layer, disposed on the substrate of the first region;
   a patterned doped layer, comprising a doped gate electrode and two contact electrodes, the doped gate electrode being disposed on the substrate of the second region, and the contact electrodes being electrically connected two sides of the first channel layer;
   a gate insulating layer, covering the first channel layer and the patterned doped layer;
   a conducting gate electrode, disposed on the gate insulating layer of the first region;

a second channel layer, disposed on the gate insulating layer of the second region;

a first electrode and a second electrode, electrically connected to each of the contact electrodes, respectively; and a third electrode and a fourth electrode, electrically connected to two sides of the second channel layer, respectively.

2. The semiconductor device of claim 1, wherein the first channel layer, the contact electrodes, the gate insulating layer, the conducting gate electrode, the first electrode and the second electrode form a first thin film transistor device, and the doped gate electrode, the gate insulating layer, the second channel layer, the third electrode and the fourth electrode form a second thin film transistor device.

3. The semiconductor device of claim 2, wherein the first thin film transistor device comprises a P type thin film transistor device, the second thin film transistor device comprises an N type thin film transistor device, and the patterned doped layer comprises a P type patterned doped layer.

4. The semiconductor device of claim 1, wherein the patterned doped layer comprises a non-implant doped layer.

5. The semiconductor device of claim 1, wherein the first channel layer comprises a poly silicon semiconductor layer, and the second channel layer comprises one of an amorphous silicon semiconductor layer, an oxide semiconductor layer and an organic semiconductor layer.

6. The semiconductor device of claim 1, further comprising at least one inter-layered dielectric (ILD) layer disposed on the gate insulating layer, the conducting gate electrode and the second channel layer, the at least one inter-layered dielectric layer and the gate insulating layer having a plurality of first contact holes exposing each of the contact electrodes, respectively, the at least one inter-layered dielectric layer having a plurality of second contact holes exposing the second channel layer, the first electrode and the second electrode being electrically connected to each of the contact electrodes through the first contact holes, respectively, and the third electrode and the fourth electrode being electrically connected to the second channel layer through the second contact holes.

7. The semiconductor device of claim 1, further comprising a first inter-layered dielectric layer disposed on the gate insulating layer, the conducting gate electrode and the second channel layer, and a second inter-layered dielectric layer overlying the first inter-layered dielectric layer, wherein the first inter-layered dielectric layer comprises a silicon oxide layer, and the second inter-layered dielectric layer comprises a silicon nitride layer.

8. The semiconductor device of claim 7, wherein the gate insulating layer, the first inter-layered dielectric layer and the second inter-layered dielectric layer have a plurality of first contact holes, the second inter-layered dielectric layer further has an opening corresponding to the second channel layer and partially exposing the first inter-layered dielectric layer, the first inter-layered dielectric layer further has a plurality of second contact holes exposing the second channel layer, the first electrode and the second electrode are electrically connected to each of the contact electrodes through the first contact holes, respectively, and the third electrode and the fourth electrode are electrically connected to the second channel layer through the second contact holes.

9. The semiconductor device of claim 1, wherein the conducting gate electrode and the second channel layer are made of a same material layer.

10. The semiconductor device of claim 1, further comprising a light-emitting device, disposed at least in the first region and electrically connected to the first electrode.

11. The semiconductor device of claim 1, wherein the second electrode and the third electrode are electrically connected.

12. The semiconductor device of claim 1, wherein the second electrode and the doped gate electrode are electrically connected.

13. The semiconductor device of claim 1, wherein the conducting gate electrode and the third electrode are electrically connected.

14. The semiconductor device of claim 1, wherein the conducting gate electrode and the doped gate electrode are electrically connected.

15. The semiconductor device of claim 1, wherein the conducting gate electrode and the second electrode partially overlap and form a first storage capacitor.

16. The semiconductor device of claim 1, wherein the patterned doped layer further comprises a storage electrode, and the conducting gate electrode and the storage electrode partially overlap and form a second storage capacitor.

17. The semiconductor device of claim 1, wherein the patterned doped layer further comprises a storage electrode, the conducting gate electrode and the second electrode partially overlap and form a first storage capacitor, the conducting gate electrode and the storage electrode partially overlap and form a second storage capacitor, and the second electrode and the storage electrode are electrically connected through a contact hole.

18. A method of forming semiconductor device, comprising:

providing a substrate, the substrate having a first region and a second region;

forming a first channel layer on the substrate of the first region;

forming a patterned doped layer on the substrate, wherein the patterned doped layer comprises two contact electrodes electrically connected two sides of the first channel layer, and a doped gate electrode disposed on the substrate of the second region;

forming a gate insulating layer on the substrate, the gate insulating layer covering the first channel layer, the contact electrodes and the doped gate electrode;

forming a conducting gate electrode on the gate insulating layer of the first region;

forming a second channel layer on the gate insulating layer of the second region;

forming a first electrode and a second electrode in the first region, the first electrode and the second electrode being electrically connected to each of the contact electrodes, respectively; and forming a third electrode and a fourth electrode in the second region, the third electrode and the fourth electrode being electrically connected to two sides of the second channel layer, respectively.

19. The method of forming semiconductor device of claim 18, wherein the first channel layer, the contact electrodes, the gate insulating layer, the conducting gate electrode, the first electrode and the second electrode form a first thin film transistor device, and the doped gate electrode, the gate insulating layer, the second channel layer, the third electrode and the fourth electrode form a second thin film transistor device.

20. The method of forming semiconductor device of claim 19, wherein the first thin film transistor device comprises a P type thin film transistor device, the second thin film transistor device comprises an N type thin film transistor device, and the patterned doped layer comprises a P type patterned doped layer.

21. The method of forming semiconductor device of claim 18, wherein the first channel layer comprises a poly silicon semiconductor layer, and the second channel layer comprises one of an amorphous silicon semiconductor layer, an oxide semiconductor layer and an organic semiconductor layer.

22. The method of forming semiconductor device of claim 18, wherein the step of forming the patterned doped layer comprises a non-implant process.

23. The method of forming semiconductor device of claim 22, further comprising performing at least one annealing process on the patterned doped layer.

24. The method of forming semiconductor device of claim 18, further comprising forming a light-emitting device in the first region subsequent to forming the first electrode and the second electrode, wherein the light-emitting device and the first electrode are electrically connected.

25. The method of forming semiconductor device of claim 18, further comprising forming at least one inter-layered dielectric (ILD) layer on the conducting gate electrode, the second channel layer and the gate insulating layer prior to forming the first electrode, the second electrode, the third electrode and the fourth electrode, forming a plurality of first contact holes in the at least one inter-layered dielectric layer and the gate insulating layer to expose each of the contact electrodes, respectively, and forming a plurality of second contact holes in the at least one inter-layered dielectric layer to expose the second channel layer, wherein the first electrode and the second electrode are electrically connected to each of the contact electrodes through the first contact holes, respectively, and the third electrode and the fourth electrode are electrically connected to the second channel layer through the second contact holes.

26. The method of forming semiconductor device of claim 18, further comprising forming a first inter-layered dielectric layer on the conducting gate electrode, the second channel layer and the gate insulating layer, and a second inter-layered dielectric layer overlying the first inter-layered dielectric layer prior to forming the first electrode, the second electrode, the third electrode and the fourth electrode, forming a plurality of first contact holes in the first inter-layered dielectric layer, the second inter-layered dielectric layer and the gate insulating layer to expose each of the contact electrodes, respectively, and forming an opening in the second inter-layered dielectric layer corresponding to the second channel layer and partially exposing the first inter-layered dielectric layer, and forming a plurality of second contact holes in the first inter-layered dielectric layer to expose the second channel layer, wherein the first electrode and the second electrode are electrically connected to each of the contact electrodes through the first contact holes, respectively, and the third electrode and the fourth electrode are electrically connected to the second channel layer through the second contact holes.

27. The method of forming semiconductor device of claim 26, wherein forming the first contact holes in the first inter-layered dielectric layer, the second inter-layered dielectric layer and the gate insulating layer, and forming the opening in the second inter-layered dielectric layer comprise performing a photolithography and etching process with a half-tone mask.

28. The method of forming semiconductor device of claim 26, wherein the first inter-layered dielectric layer comprises a silicon oxide layer, and the second inter-layered dielectric layer comprises a silicon nitride layer.

29. The method of forming semiconductor device of claim 18, wherein the conducting gate electrode and the second channel layer are made of a same material layer, and defined by a same photolithography and etching process.

30. An electroluminescent device, disposed on a substrate, the substrate having a first region and a second region, the electroluminescent device comprising:
 a first channel layer, disposed on the substrate and in the first region;
 a patterned doped layer comprising a doped gate electrode and two contact electrodes, wherein the doped gate electrode is disposed on the substrate and in the second region, and the contact electrodes are electrically connected to two sides of the first channel layer, respectively;
 a gate insulating layer, covering the first channel layer and the patterned doped layer;
 a conducting gate electrode, disposed on the gate insulating layer and in the first region;
 a second channel layer, disposed on the gate insulating layer and in the second region;
 a first electrode and a second electrode, electrically connected to the contact electrodes, respectively;
 a third electrode and a fourth electrode, electrically connected to two sides of the second channel layer, respectively; and
 a light-emitting device, electrically connected to the first electrode.

31. The electroluminescent device of claim 30, wherein the light-emitting device comprises an anode, a light-emitting layer and a cathode, and the anode is electrically connected to the first electrode.

32. The electroluminescent device of claim 30, wherein the conducting gate electrode and the third electrode are electrically connected.

33. The electroluminescent device of claim 30, wherein the conducting gate electrode and the second electrode partially overlap and form a first storage capacitor.

34. The electroluminescent device of claim 30, further comprising a power line, a scan line and a data line, wherein the power line is electrically connected to the second electrode, the scan line is electrically connected to the conducting gate electrode, and the data line is electrically connected to the fourth electrode.

* * * * *